US011108416B2

(12) United States Patent
Wei et al.

(10) Patent No.: US 11,108,416 B2
(45) Date of Patent: Aug. 31, 2021

(54) LOW COMPLEXITY PUNCTURING METHOD FOR LOW-RATE POLAR CODES

(71) Applicant: QUALCOMM Incorporated, San Diego, CA (US)

(72) Inventors: Chao Wei, Beijing (CN); Jing Jiang, San Diego, CA (US); Gabi Sarkis, San Diego, CA (US); Changlong Xu, Beijing (CN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/474,474

(22) PCT Filed: Feb. 7, 2018

(86) PCT No.: PCT/CN2018/075546
§ 371 (c)(1),
(2) Date: Jun. 27, 2019

(87) PCT Pub. No.: WO2018/145634
PCT Pub. Date: Aug. 16, 2018

(65) Prior Publication Data
US 2019/0372608 A1     Dec. 5, 2019

(30) Foreign Application Priority Data

Feb. 7, 2017   (WO) ................ PCT/CN2017/073034

(51) Int. Cl.
*H03M 13/00*     (2006.01)
*H03M 13/13*     (2006.01)

(52) U.S. Cl.
CPC ....... *H03M 13/6362* (2013.01); *H03M 13/13* (2013.01); *H03M 13/6356* (2013.01)

(58) Field of Classification Search
None
See application file for complete search history.

(56) References Cited

U.S. PATENT DOCUMENTS 10,313,057 B2 *   6/2019   Lin .................... H04L 1/0054
2015/0295593 A1 *  10/2015   Trifonov ............... H03M 13/13
                                                  714/776

(Continued)

FOREIGN PATENT DOCUMENTS

CN     103023618 A     4/2013
CN     106230489 A    12/2016

(Continued)

OTHER PUBLICATIONS

L. Zhang, Z. Zhang, X. Wang, Q. Yu and Y. Chen, "On the puncturing patterns for punctured polar codes," 2014 IEEE International Symposium on Information Theory, Honolulu, HI, 2014, pp. 121-125, doi: 10.1109/ISIT.2014.6874807. (Year: 2014).*

(Continued)

*Primary Examiner* — Daniel F. McMahon
(74) *Attorney, Agent, or Firm* — Qualcomm Incorporated (57) ABSTRACT

Features of the present disclosure implement a low complexity rate-matching design for polar codes that supports full rate-matching granularity, in some cases without good bit re-estimation after puncturing. In particular, features of the present disclosure provide techniques for adjusting the information bits allocation based on the number of punctured bits (P) for block puncturing polar codes. Particularly, features of the present disclosure determine the number of information bits for each sector based on a capacity formula after the puncturing.

28 Claims, 9 Drawing Sheets

(56) References Cited

U.S. PATENT DOCUMENTS

| | | | |
|---|---|---|---|
| 2015/0333769 A1 | 11/2015 | Jeong et al. | |
| 2016/0285479 A1* | 9/2016 | El-Khamy | H03M 13/616 |
| 2017/0331577 A1* | 11/2017 | Parkvall | H04L 5/1469 |
| 2018/0183464 A1* | 6/2018 | Ge | H04L 1/0041 |
| 2018/0198564 A1* | 7/2018 | Yang | H04L 1/0067 |

FOREIGN PATENT DOCUMENTS

| | | |
|---|---|---|
| EP | 2722993 A1 | 4/2014 |
| WO | 2015180187 A1 | 12/2015 |

OTHER PUBLICATIONS

Ericsson: "Consideration of Implementation Aspects of Polar Codes," 3GPP Draft; R1-1611318, 3GPP TSG RAN WG1 Meeting #87, Reno, USA, Nov. 6, 2016 (Nov. 6, 2016), 6 pages, Retrieved from the Internet: URL: http://www.3gpp.org/ftp/tsg_ran/WG1_RL1/TSGR1_87/Docs/ .

Huawei., et al., "Polar Code Construction for NR," 3GPP Draft; R1-1608862, 3GPP TSG RAN WG1 Meeting #86bis, Lisbon, Portugal, Oct. 9, 2016 (Oct. 9, 2016), 8 pages, Retrieved from the Internet: URL: http://www.3gpp.org/ftp/Meetings_3GPP_SYNC/RAN1/Docs/.

Inter Digital Communications: "Performance Evaluation of Puncturing Schemes for Polar Codes," 3GPP TSG RAN WG1 Meeting #86, R1-167566, Gothenburg, Sweden, Aug. 26, 2016, 7 pages.

International Search Report and Written Opinion—PCT/CN2018/075546—ISA/EPO—dated Apr. 26, 2018.

International Search Report and Written Opinion—PCT/CN2017/073034—ISA/EPO—dated Oct. 27, 2017.

Mediatek Inc: "Examination of NR Coding Candidates for Low-Rate Applications", 3GPP Draft, 3GPP TSG RAN WG1 Meeting #86, R1-167871 Examination of NR Coding Candidates for Low-Rate Applications, 3rd Generation Partnership Project (3GPP), Mobile Competence Centre, 650, Route Des Lucioles, F-06921 Sophia-Anti, vol. RAN WG1, No. Gothenburg, Sweden, Aug. 22, 2016-Aug. 26, 2016, Aug. 28, 2016 (Aug. 28, 2016), XP051142643, 15 Pages.

Qualcomm Incorporated: "Polar Code Information Bit Allocation and Nested Extension Construction", 3GPP Draft, 3GPP TSG-RAN WG1 Adhoc, R1-1701187 Polar Code Information Bit Allocation and Nested Extension Construction, 3rd Generation Partnership Project (3GPP), Mobile Competence Centre, 650, Route Des Lucioles, F-06921, vol. RAN WG1, No. Spokane, USA, Jan. 16, 2017-Jan. 20, 2017, Jan. 18, 2017 (Jan. 18, 2017), XP051222249, 13 Pages.

Mediatek Inc: "Examination of NR Coding Candidates for Low-Rate Applications", 3GPP Draft, 3GPP TSG RAN WG1 Meeting #86, R1-167871 Examination of NR Coding Candidates for Low-Rate Applications, 3rd Generation Partnership Project (3GPP), Mobile Competence Centre, 650, Route Des Lucioles, F-06921 Sophia-Anti, vol. Ran WG1, No. Gothenburg, Sweden, Aug. 22, 2016-Aug. 26, 2016, Aug. 28, 2016 (Aug. 28, 2016), XP051142643, 15 Pages, Retrieved from the Internet: URL: http://www.3gpp.org/ftp/tsg_ran/WG1_RL1/TSGR1_86/Docs/, [retrieved on Aug. 28, 2016], *Section 2*, *Appendix*, *Fig. 2 and text*, "In fig. 2 ...".

Qualcomm Incorporated: "Polar Code Information Bit Allocation and Nested Extension Construction", 3GPP Draft, 3GPP TSG-RAN WG1 Adhoc, R1-1701187 Polar Code Information Bit Allocation and Nested Extension Construction, 3rd Generation Partnership Project (3GPP), Mobile Competence Centre, 650, Route Des Lucioles, F-06921, vol. Ran WG1, No. Spokane, USA, Jan. 16, 2017-Jan. 20, 2017, Jan. 18, 2017 (Jan. 18, 2017), XP051222249, 13 Pages, Retrieved from the Internet: URL: http://www.3gpp.org/ftp/tsg_ran/WG1_RL1/TSGR1_AH/NR_AH_1701/Docs/, [retrieved on Jan. 18, 2017],*the whole document*.

Supplementary European Search Report—EP18751498—Search Authority—Munich—dated Oct. 9, 2020.

* cited by examiner

LOW COMPLEXITY PUNCTURING METHOD FOR LOW-RATE POLAR CODES

CROSS-REFERENCE TO RELATED APPLICATION

This application is a 35 U.S.C. § 371 National Phase Application of PCT Application No. PCT/CN2018/075546 filed Feb. 7, 2018, entitled "A LOW COMPLEXITY PUNCTURING METHOD FOR LOW-RATE POLAR CODES," which claims priority to PCT Application No. PCT/CN2017/073034 filed Feb. 7, 2017, entitled "A LOW COMPLEXITY PUNCTURING METHOD FOR LOW-RATE POLAR CODES." The disclosure of these prior application are hereby incorporated by reference herein in their entirety.

BACKGROUND

Aspects of the present disclosure relate generally to wireless communication networks, and more particularly, to polarization code rate matching.

Wireless communication networks are widely deployed to provide various types of communication content such as voice, video, packet data, messaging, broadcast, and so on. These systems may be multiple-access systems capable of supporting communication with multiple users by sharing the available system resources (e.g., time, frequency, and power). Examples of such multiple-access systems include code-division multiple access (CDMA) systems, time-division multiple access (TDMA) systems, frequency-division multiple access (FDMA) systems, orthogonal frequency-division multiple access (OFDMA) systems, and single-carrier frequency division multiple access (SC-FDMA) systems.

These multiple access technologies have been adopted in various telecommunication standards to provide a common protocol that enables different wireless devices to communicate on a municipal, national, regional, and even global level. For example, a fifth generation (5G) wireless communications technology (which can be referred to as new radio (NR)) is envisaged to expand and support diverse usage scenarios and applications with respect to current mobile network generations. In an aspect, 5G communications technology can include: enhanced mobile broadband addressing human-centric use cases for access to multimedia content, services and data; ultra-reliable-low latency communications (URLLC) with certain specifications for latency and reliability; and massive machine type communications, which can allow a very large number of connected devices and transmission of a relatively low volume of non-delay-sensitive information. As the demand for mobile broadband access continues to increase, however, further improvements in NR communications technology and beyond may be desired.

One such need for improvement may relate to the reliability of data transmissions to ensure high quality of communication. Generally, to that end, a source encoder of the transmitting device (e.g., base station or user equipment (UE)) may typically compress the data to be transmitted over a communication channel, while a channel encoder may add further redundancy to the compressed data in order to protect the data against noise in the transmission channel. In turn, a receiver (e.g., base station or UE) may receive the encoded data and use a channel decoder to perform the inverse of channel encoding.

Channel encoding generally includes converting a transport block (e.g., data sought for transmission) into a codeword. A codeword includes error protection bits in order to make it suitable for transmission over the wireless channel. Conventional techniques achieve the above goals by employing a linear block encoder that multiplies a transport block using a matrix. One example of a linear block encoder is a technique utilizing polar codes. A polar code is a linear block error correcting code. The code construction is based on a multiple recursive concatenation of a short kernel codes which transforms the physical channel into multiple virtual channels. However, when the number of recursions becomes large, the virtual channels tend to either have high reliability or low reliability (in other words, they polarize), and thus the data bits are allocated to the most reliable channels.

Typically, the codeword length of conventional polar codes must be a power of two. Because puncturing is required to support arbitrary code length, code bit puncturing may change the polarization structure and require good bit re-estimation after puncturing. In coding theory, "puncturing" is the process of removing some of the parity bits after encoding with an error-correction code. A Gaussian approximation scheme of complexity $O(N \cdot \log 2(N))$ for good bit re-estimation is used with the signal to noise ratio (SNR) assumptions for different code rates that is known by both transmitter and receiver. However, such channel re-estimation procedures are generally resource intensive and add delay to the transmission of the codewords. Thus, further improvements in wireless communication operations may be desired.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Aspects of the present disclosure disclose techniques solve the above-identified problems by implementing a low complexity rate-matching design for polar code that supports full rate-matching granularity, in some cases without good bit re-estimation after puncturing. In particular, features of the present disclosure provide techniques for adjusting the information bits allocation based on the number of punctured bits (P) for the block puncturing polar codes. For example, features of the present disclosure determine the number of information bits for each sector (e.g., K0, K1, K3, and K4) based on capacity after the puncturing. Thus, the features of the present disclosure provide an advantage of shorter delay compared to the conventional techniques. Particularly, the decoding complexity and delay of the proposed puncturing polar code may be a function of the size $M_1$ instead of $N=2^n$ of conventional systems since the first $N-M_1$ bit channels are set to frozen bits.

In one example, a method for rate matching codes polarization of wireless communications is disclosed. The method may include determining a number of punctured bits for a block puncturing polar codes, adjusting allocation of information bits based on the number of punctured bits, and generating a codeword for transmission over a wireless channel based on the allocation of the information bits.

In another example, an apparatus for rate matching codes polarization of wireless communications is disclosed. The apparatus may include a memory configured to store instructions and a processor communicatively coupled with the memory. The processor may be configured to execute the instructions to determine a number of punctured bits for block puncturing polar codes. The instructions may further be configured to adjust allocation of information bits based on the number of punctured bits, and generate a codeword for transmission over a wireless channel based on the allocation of the information bits.

In another example, a computer readable medium for rate matching codes polarization of wireless communications is disclosed. The computer readable medium may include code for determining a number of punctured bits for a block puncturing polar codes, adjusting allocation of information bits based on the number of punctured bits, and generating a codeword for transmission over a wireless channel based on the allocation of the information bits.

In another example, another apparatus for rate matching codes polarization of wireless communications is disclosed. The apparatus may include means for determining a number of punctured bits for a block puncturing polar codes, adjusting allocation of information bits based on the number of punctured bits, and generating a codeword for transmission over a wireless channel based on the allocation of the information bits.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

As discussed above, code bit puncturing may change the polarization structure and require channel re-estimation after performing the puncturing. However, the channel re-estimation procedure may be resource intensive and add delay to the transmission of the codewords. Some methods of baseline rate-matching of polar codes include applying a quasi-uniform puncturing (QUP) method. The QUP method constructs a polar code by calculating the reliability of each synthesized sub-channel as a reliable metric using Density Evolution based on a Gaussian approximation (DE/GA). The sub-channels with high reliability are chosen to transmit the information bits, while the bits for the unreliable sub-channels are set to zero, referred to or called frozen bits. This set of unreliable positions is called the frozen-set (F). Given a combination of code rate (R) and code length (M), both encoder and decoder have to compute this frozen-set (F) before encoding or decoding. The uniqueness of the frozen set (F) between encoder and decoder should be secured.

Due to the fact that a polar code with a mother code length N that is a power of two can be regarded as a nested combination of two polar codes of length N/2, such a method constructs an ordered sequence of bit positions (index sequence) such that the ordered sequence for the polar codes of length N/2 is a subset of the ordered sequence for the polar codes of length N. This method, referred to as "bit reversal puncturing" relies on selecting the first K good bits according to a predetermined good bit order and skipping the frozen bits before allocating the K data bits. A good-bit-order list is a sequence of input bit indices where the order indicates the possibility to be selected as a good bit (See FIG. 3). Because of the nested property, a single good-bit-order list of largest N of interest is needed to be stored. However, one concern with the bit-reversal puncturing channel is the decoding latency for control channels with a large number of blind decoding. This is, because the decoding complexity and delay of the punctured polar code is a function of size $N=2^n$, but not the codeword size M.

Another technique, referred to as block puncturing, has also been proposed for polar codes. In this technique, in order to attain any target codeword length M, the scheme simply removes (i.e. does not transmit) the first $P=2^{\lceil log_2(M) \rceil}-M$ consecutive coded bits and sets the first P bit-channels to frozen bits due to zero capacity by puncturing. However, this block puncturing scheme has serious performance loss compared to the bit-reversal puncturing when the puncturing is heavy (e.g., the number of punctured bits (P) is close to N/2 where $N=2^{\lceil log_2(M) \rceil}$. This is because the block puncturing may change the polarization structure and the determination of the information set by skipping good bit indices. That is, if the upper part of the coded bits (e.g., channel after XOR) is punctured, then the lower part (e.g., channel after repetition) may see a channel of W instead of W+ since some bits may not be repeated. Therefore, the K information bit allocation derived from the bit-order sequence based on full polarization may not be optimistic.

Aspects of the present disclosure address the above-identified problem by adjusting the information bits allocation based on the number of punctured bits (P) for the block puncturing polar codes. Particularly, features of the present disclosure determine the number of information bits for each sector (e.g., K0, K1, K3, and K4) (See FIG. 4) based on capacity formula after the puncturing. For low rate polar codes (e.g., $R=K/M \leq \frac{1}{3}$), the block puncturing may be applied to the upper part of the coded bits (e.g., channel after XOR) which is then divided into four sectors (or more for finer granularity). If there is any punctured bit in the sector, then no information bits are allocated to that sector. Additionally, frozen bit positions (or other $K_i$ values) may be selected by using the Gaussian approximation (e.g. for $M=m*2^n$, m=1, 3, 5 and 7) or according to a predetermined good bit order and skipping the frozen bits before allocating K info bits. The solution of the present disclosure may have one or more advantages, including reduced decoding latency because the decoding complexity and delay of the proposed puncturing polar code is a function of the size $M_1$ instead of $N=2^n$ since the first $N-M_1$ bit channels are set to frozen bits.

Various aspects are now described with reference to the drawings. In the following description, for purposes of explanation, numerous specific details are set forth in order to provide a thorough understanding of one or more aspects. It may be evident, however, that such aspect(s) may be practiced without these specific details. Additionally, the term "component" as used herein may be one of the parts that make up a system, may be hardware, firmware, and/or software stored on a computer-readable medium, and may be divided into other components.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in other examples.

Figure 1:
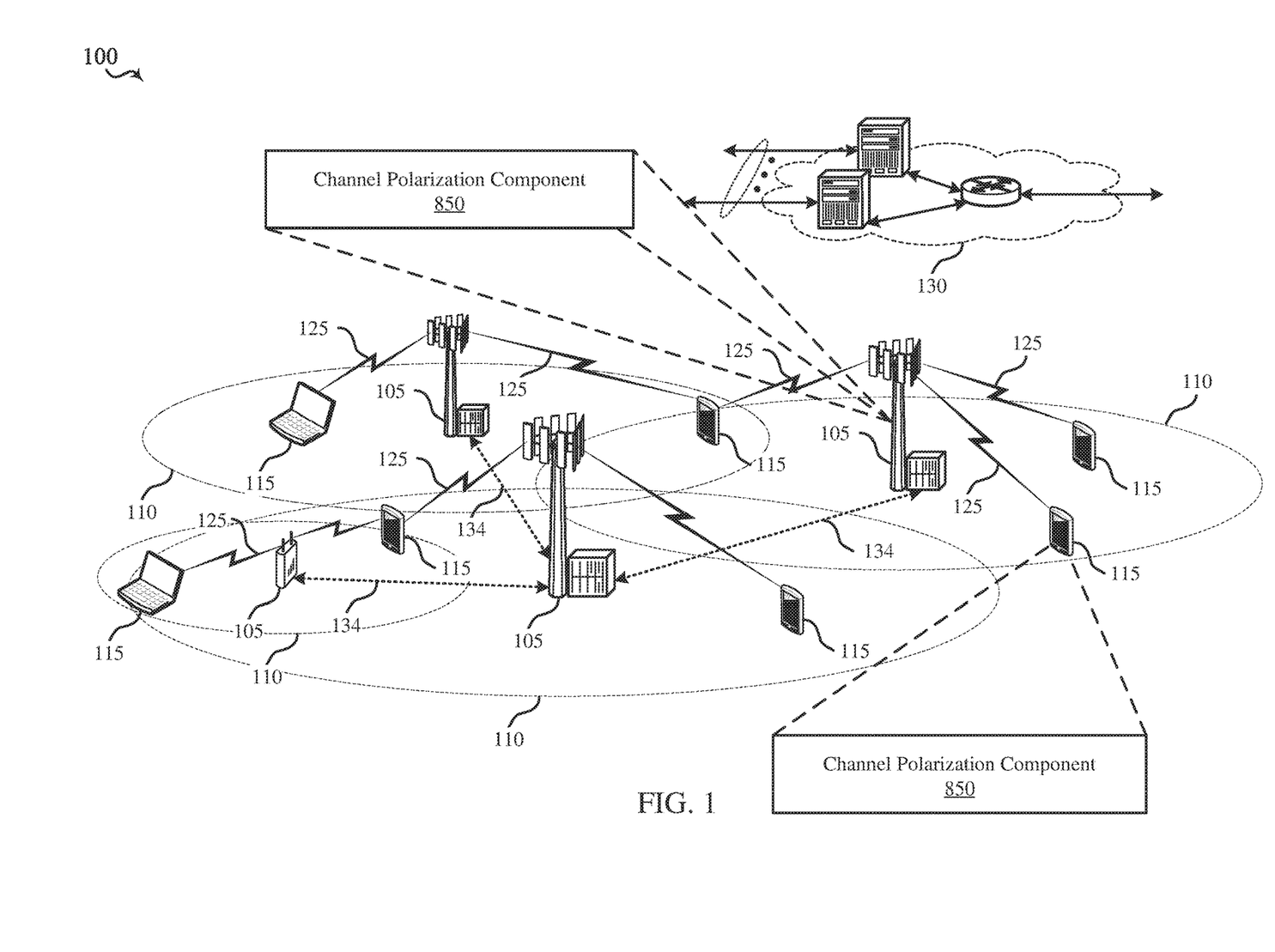
FIG. 1 is a schematic diagram of an example wireless communications system having a channel polarization component to adjust allocation of one or more information bits based on the number of punctured bits for block puncturing polar codes in accordance with aspects of the present disclosure.

Referring to FIG. 1, in accordance with various aspects of the present disclosure, an example wireless communication network 100 may include one or more base stations 105, one or more UEs 115, and a core network 130. The core network 130 may provide user authentication, access authorization, tracking, internet protocol (IP) connectivity, and other access, routing, or mobility functions. The base stations 105 may interface with the core network 130 through backhaul links 134 (e.g., S1, etc.). The base stations 105 may perform radio configuration and scheduling for communication with the UEs 115, or may operate under the control of a base station controller (not shown). In various examples, the base stations 105 may communicate, either directly or indirectly (e.g., through core network 130), with one another over backhaul links 134 (e.g., X1, etc.), which may be wired or wireless communication links. In some examples, the base station 105 and the UE 115, operating as the transmitting device, may include a channel polarization component 850 (see FIG. 8) configured to perform channel polarization by adjusting allocation of one or more information bits based on the number of punctured bits for block puncturing polar codes, as described in more detail below.

The base stations 105 may wirelessly communicate with the UEs 115 via one or more base station antennas. Each of the base stations 105 may provide communication coverage for a respective geographic coverage area 110. In some examples, base stations 105 may be referred to as a base transceiver station, a radio base station, an access point, a radio transceiver, a NodeB, eNodeB (eNB), Home NodeB, a Home eNodeB, gNodeB, gNB, a relay, or some other suitable terminology. The geographic coverage area 110 for a base station 105 may be divided into sectors or cells making up only a portion of the coverage area (not shown). The wireless communication network 100 may include base stations 105 of different types (e.g., macro base stations or small cell base stations, described below). Additionally, the plurality of base stations 105 may operate according to different ones of a plurality of communication technologies (e.g., 5G, 4G/LTE, 3G, Wi-Fi, Bluetooth, etc.), and thus there may be overlapping geographic coverage areas 110 for different communication technologies.

In some examples, the wireless communication network 100 may be or include a Long Term Evolution (LTE) or LTE-Advanced (LTE-A) technology network. The wireless communication network 100 may also be a next generation technology network, such as a 5G wireless communication network. In LTE/LTE-A networks, the term evolved node B (eNB) or gNB may be generally used to describe the base stations 105, while the term UE may be generally used to describe the UEs 115. The wireless communication network 100 may be a heterogeneous LTE/LTE-A network in which different types of eNBs provide coverage for various geographical regions. For example, each eNB or base station 105 may provide communication coverage for a macro cell, a small cell, or other types of cell. The term "cell" is a 3GPP term that can be used to describe a base station, a carrier or component carrier associated with a base station, or a coverage area (e.g., sector, etc.) of a carrier or base station, depending on context.

A macro cell may generally cover a relatively large geographic area (e.g., several kilometers in radius) and may allow unrestricted access by the UEs 115 with service subscriptions with the network provider.

A small cell may include a relative lower transmit-powered base station, as compared with a macro cell, that may operate in the same or different frequency bands (e.g., licensed, unlicensed, etc.) as macro cells. Small cells may include pico cells, femto cells, and micro cells according to various examples. A pico cell, for example, may cover a small geographic area and may allow unrestricted access by the UEs 115 with service subscriptions with the network provider. A femto cell may also cover a small geographic area (e.g., a home) and may provide restricted access and/or unrestricted access by the UEs 115 having an association with the femto cell (e.g., in the restricted access case, the UEs 115 in a closed subscriber group (CSG) of the base station 105, which may include the UEs 115 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The communication networks that may accommodate some of the various disclosed examples may be packet-based networks that operate according to a layered protocol stack and data in the user plane may be based on the IP. A radio link control (RLC) layer may perform packet segmentation and reassembly to communicate over logical channels. A MAC layer may perform priority handling and multiplexing of logical channels into transport channels. The MAC layer may also use HARQ to provide retransmission at the MAC layer to improve link efficiency. In the control plane, the radio resource control (RRC) protocol layer may provide establishment, configuration, and maintenance of an RRC connection between a UE 115 and the base stations 105. The RRC protocol layer may also be used for core network 130 support of radio bearers for the user plane data. At the physical (PHY) layer, the transport channels may be mapped to physical channels.

The UEs 115 may be dispersed throughout the wireless communication network 100, and each UE 115 may be stationary or mobile. A UE 115 may also include or be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may be a cellular phone, a personal digital assistant (PDA), a wireless modem, a wireless communication device, a handheld device, a tablet computer, a laptop computer, a cordless phone, a wireless local loop (WLL) station, an entertainment device, a vehicular component, or any device capable of communicating in wireless communication network 100. Additionally, a UE 115 may be Internet of Things (IoT) and/or machine-to-machine (M2M) type of device, e.g., a low power, low data rate (relative to a wireless phone, for example) type of device, that may in some aspects communicate infrequently with wireless communication network 100 or other UEs. A UE 115 may be able to communicate with various types of base stations 105 and network equipment including macro eNBs, small cell eNBs, relay base stations, and the like.

A UE 115 may be configured to establish one or more wireless communication links 125 with one or more base stations 105. The wireless communication links 125 shown in wireless communication network 100 may carry UL transmissions from a UE 115 to a base station 105, or downlink (DL) transmissions, from a base station 105 to a UE 115. The downlink transmissions may also be called forward link transmissions while the uplink transmissions may also be called reverse link transmissions. Each wireless communication link 125 may include one or more carriers, where each carrier may be a signal made up of multiple sub-carriers (e.g., waveform signals of different frequencies) modulated according to the various radio technologies described above. Each modulated signal may be sent on a different sub-carrier and may carry control information (e.g., reference signals, control channels, etc.), overhead information, user data, etc. In an aspect, the communication links 125 may transmit bidirectional communications using frequency division duplex (FDD) (e.g., using paired spectrum resources) or time division duplex (TDD) operation (e.g., using unpaired spectrum resources). Frame structures may be defined for FDD (e.g., frame structure type 1) and TDD (e.g., frame structure type 2). Moreover, in some aspects, the communication links 125 may represent one or more broadcast channels.

In the wireless communication network 100, the one or more UEs 115 may either be in a radio resource control (RRC) connected mode or RRC idle mode. During the RRC connected mode, the UEs 115 may maintain an established communication with the base station 105. During the RRC idle mode, the UEs 115 may be in sleep mode without any communication with the base station 105. The sleep mode, for example, may afford the UEs 115 an opportunity to conserve battery power.

In some aspects of the wireless communication network 100, base stations 105 or UEs 115 may include multiple antennas for employing antenna diversity schemes to improve communication quality and reliability between base stations 105 and UEs 115. Additionally or alternatively, base stations 105 or UEs 115 may employ multiple input multiple output (MIMO) techniques that may take advantage of multi-path environments to transmit multiple spatial layers carrying the same or different coded data.

In situations when the UEs 115 are in RRC idle mode, the base station 105 may use a paging process to initiate access the UE 115. The term "paging process" or "paging message" may refer to any control message transmitted by the base station 105 to alert the UE 115 of an existence of a page. Thus, the one or more UEs 115 in RRC idle mode may awake only periodically to listen for paging messages. Because the UEs 115 in the RRC idle mode may only awake periodically, it may be challenging for the base stations 105 to effectively utilize beamforming to direct a page towards a particular UE 115. Specifically, because the base station may not be aware of the exact location or cell in which the UE 115 may awake to listen for the paging message, the base station 105 generally transmits over multiple directions (referred to as a transmission sweep) in order to ensure that the idle mode UE receives the paging message. However, as discussed above, such transmission sweeps are resource intensive.

The wireless communication network 100 may support operation on multiple cells or carriers, a feature which may be referred to as carrier aggregation (CA) or multi-carrier operation. A carrier may also be referred to as a component carrier (CC), a layer, a channel, etc. The terms "carrier," "component carrier," "cell," and "channel" may be used interchangeably herein. A UE 115 may be configured with multiple downlink CCs and one or more uplink CCs for carrier aggregation. Carrier aggregation may be used with both FDD and TDD component carriers.

Figure 2:
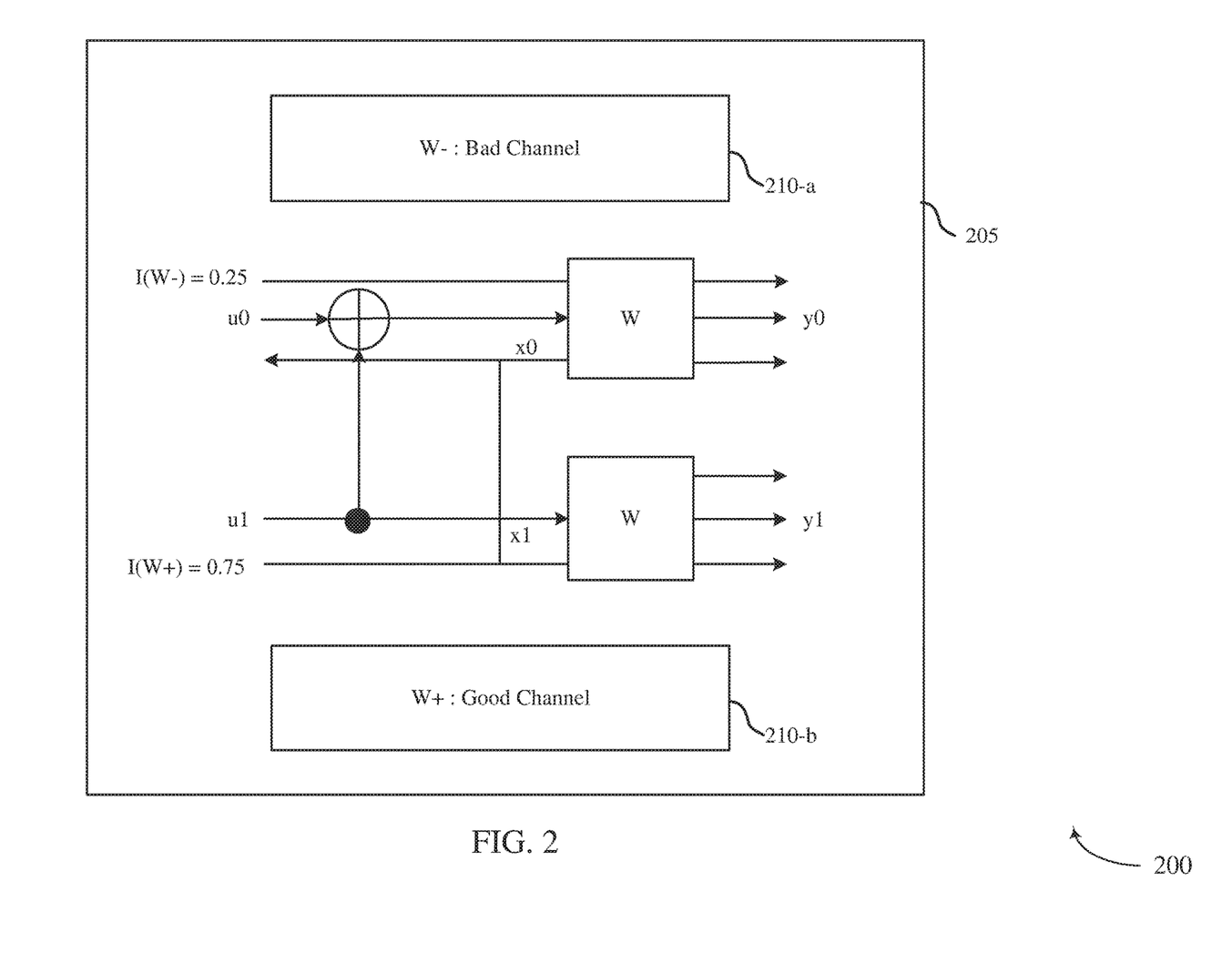
FIG. 2 is a block diagram of an example of a channel polarization processing architecture in accordance with aspects of the present disclosure.

Referring now to FIG. 2, an example channel polarization processing architecture 200 for two-input is described. As discussed above, the polar code construction is based on a multiple recursive concatenation of a short kernel code which transforms the physical channel 205 into multiple virtual outer channels 210 (e.g., W− bad channel 210-*a* and W+ good channel 210-*b*). The terms "bad channel" and "good channel" may refer to the channel quality based on the signal-to-noise (SNR) ratio and/or reliability for each channel. For example, if a channel has a low SNR ratio, it may be considered a "bad channel," while a high SNR ratio may be associated with "good channel." When the number of recursions becomes large, the virtual channels tend to either have high reliability or low reliability (in other words, they polarize), and the data bits are allocated to the most reliable channels. In the illustrated example, a pair of identical binary-input channels 205 are transformed into two distinct channels 210 of different qualities, e.g., one better and one worse than the original binary-input channel 205. In such instance, channel W− 210-*a* (e.g., "bad channel") may include input $u_0$ and outputs $y_0$ and $y_1$. Similarly, the channel W+ 210-*b* (e.g., "good channel") may include input $u_1$ and outputs $y_0$ and $y_1$. The channel polarization for the two channels 210 may be achieved as follow, where channel W− 210-*a* has input $U_0$ and output $y_0$, and channel W+ has input $U_1$ and output $y_1$:

$U_0 = X_0 \oplus X_1 = Y_0 \oplus Y_1$ parity-check

Erasure probability, $\varepsilon^- = 1-(1-\varepsilon)^2 = 2\varepsilon - \varepsilon^2$.

$U_1 = X_1 = X_0 \oplus U_0$ repetition,

Erasure probability, $\varepsilon^+ = \varepsilon^2$.

In some examples, the above operation can be performed recursively where a set of $N=2^n$ "bit-channels" of varying qualities can be obtained. For instance, the operation can include the transmission of the info bits over a "good" channel, and the transmission of the known "frozen" bits over the "bad" channel. Optionally, CRC can be added to the info-block to aid with list SC decoding.

Figure 3:
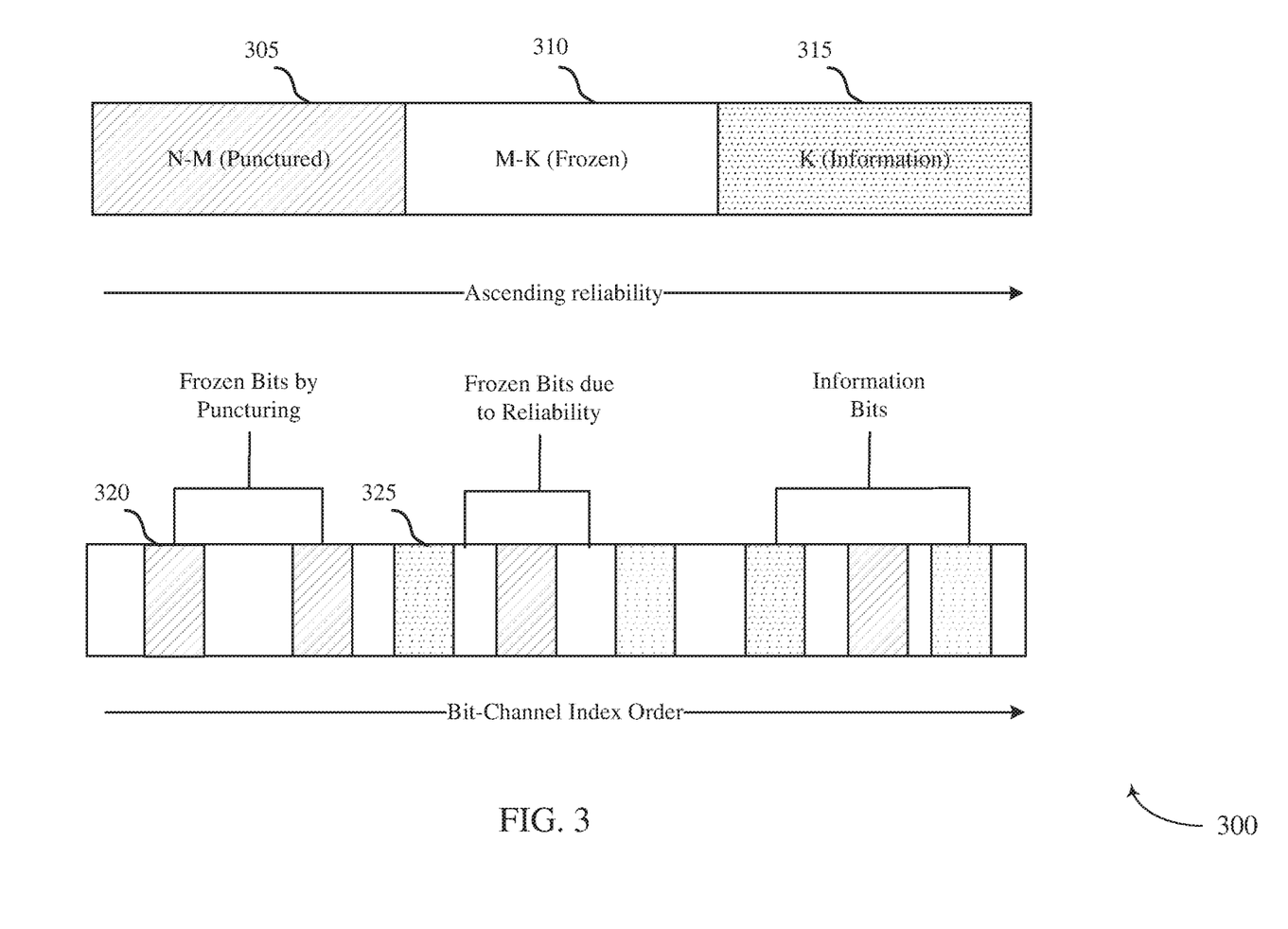
FIG. 3 is a block diagram of an example of a bit structure as input into an encoder based on bit reversal puncturing in accordance with aspects of the present disclosure.

Referring to FIG. 3, one solution that includes a bit structure resulting from a bit reversal puncturing technique 300 is disclosed. The bit reversal puncturing technique 300 relies on selecting the first K good bits 305 according to a predetermined good bit order and skipping the frozen bits 310 before allocating the K data bits 315. Particularly, the method applies the quasi-uniform puncturing pattern and sets the corresponding input bits as frozen bits 325. In other words, the locations of the punctured bits 320 and those of the bit-channels with zero capacity are determined by bit-reversing the descending-ordered binary indices [0, 1, . . . , N−2, N−1] and marking the N−M indices with highest bit-reversed value as punctured positions, e.g., P=[BitRev (M), . . . , BitRev(N−2), BitRev(N−1)] where M is the code length after puncturing.

However, the concern with the bit reversal puncturing technique 300 is the decoding latency. This is especially true for control channels with large number of blind decoding. This is because the decoding complexity and delay of this punctured polar code is a function of size $N=2^n$ but not the codeword size M.

Another solution (not shown) relates to block puncturing without information set optimization. In this alternative solution, a simple puncturing scheme was proposed for polar codes. To attain any target codeword length M, the scheme simply removes the first $P = 2^{\lceil \log_2(M) \rceil} - M$ consecutive coded bits and sets the first P bit-channels to frozen bits due to zero capacity by puncturing. However, this scheme has serious performance loss compared to the bit-reversal puncturing when the puncturing is heavy, e.g., the number of punctured bits P is closed to N/2 where $N = 2^{\lceil \log_2(M) \rceil}$. This is because the block puncturing will change the polarization structure and the determination of the info set by skipping good bit indices on the punctured bits is not sufficient. That is, if the upper part of the coded bits (channel after XOR) is punctured then the lower part (channel after repetition) will see a channel of W instead of W+ since some bits are not repeated. Therefore, the K info bits allocation derived from the bit-order sequence based on full polarization will be too optimistic.

Figure 4:
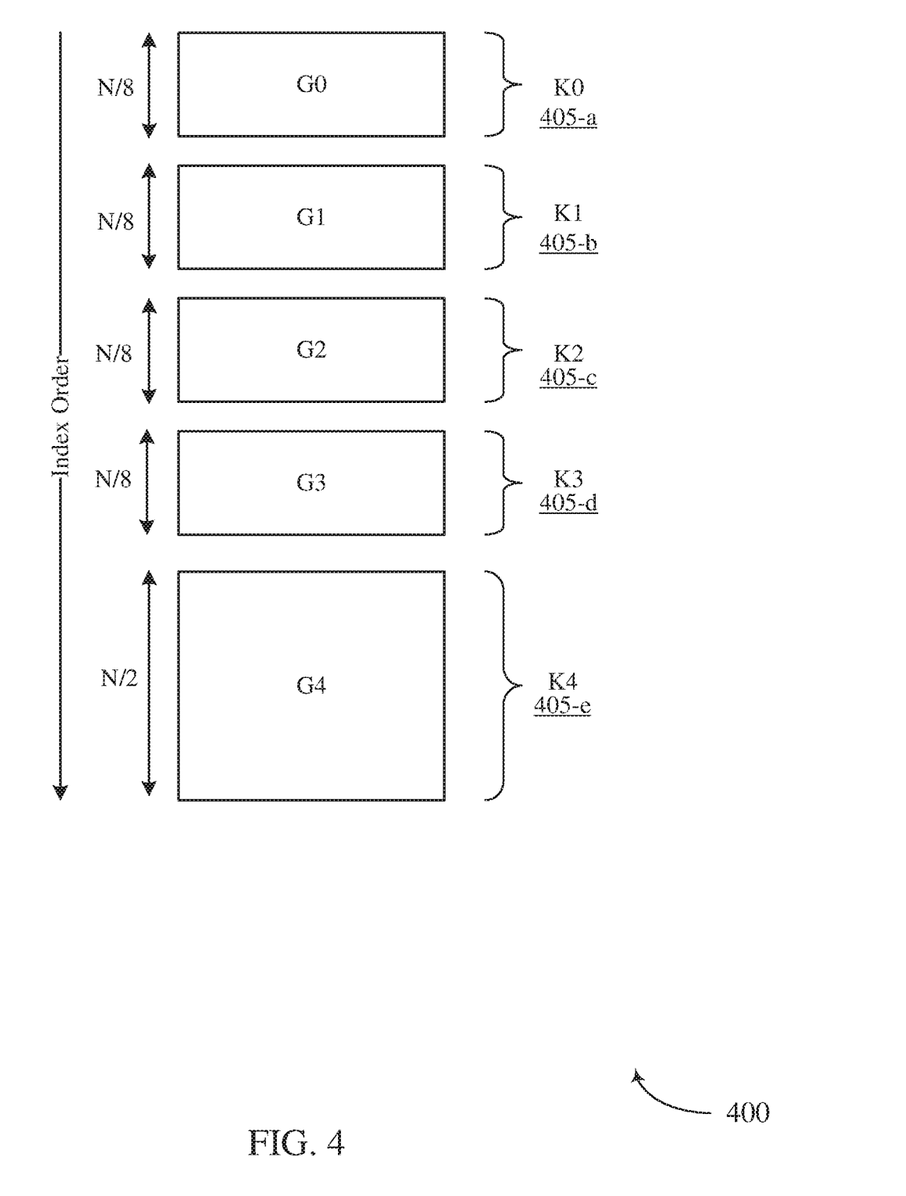
FIG. 4 is a schematic diagram of an example a bit index structure related to an example of adjusting the information bits allocation based on the number of punctured bits for the block puncturing polar codes in accordance with aspects of the present disclosure.

Referring to FIG. 4, a diagram 400 illustrates a solution in accordance to the present disclosure that adjusts the allocation of the information bits based on the number of punctured bits for the block puncturing polar codes. For example, the allocation of the information bits may be identified by determining the number of information bits in each sector 405 (of n K info bits, or Kn, e.g. K0 405-*a*, K1 405-*b*, K2 405-*c*, K3 405-*d*, and K4 405-*e*), where K=K0+K1+K2+K3+K4 based on capacity after the puncturing. For low rate polar codes, e.g., R=(K/M)≤⅓, the block puncturing may be applied to the upper part of the coded bits, which is then divided into four sectors 405 (or finer granularity). If there is any punctured bit in the sector 405, then no information bit is allocated to that sector, e.g., $K_i=0$, setting as the frozen bits. Then, other frozen positions (or other $K_i$ values) are selected by using the Gaussian approximation (for $M=m*2^n$, m=1, 3, 5 and 7) or according to a predetermined good bit order and skipping the frozen bits before allocating K info bits.

For example:

$0 < N-M \leq (N/8): K_0=0, M_1=(7N/8)<M;$ $0 < N-M \leq (N/4): K_0=K_1=0, M_1=(3N/4)<M;$ $0 < N-M \leq (3N/8): K_0=K_1=K_2=0, M_1=(5N/8)<M;$ and $0 < N-M < (N/2): K_0=K_1=K_2=K_3=0, M_1=(N/2)<M.$ Referring to FIG. 5 includes an example processing architecture 500 for allocating information bits using a capacity formula in accordance with aspects of the present disclosure. The architecture 500 includes a physical channel 505 that is represented by a plurality of virtual channels. The channels may be subdivided into different sectors 510.

Figure 5:
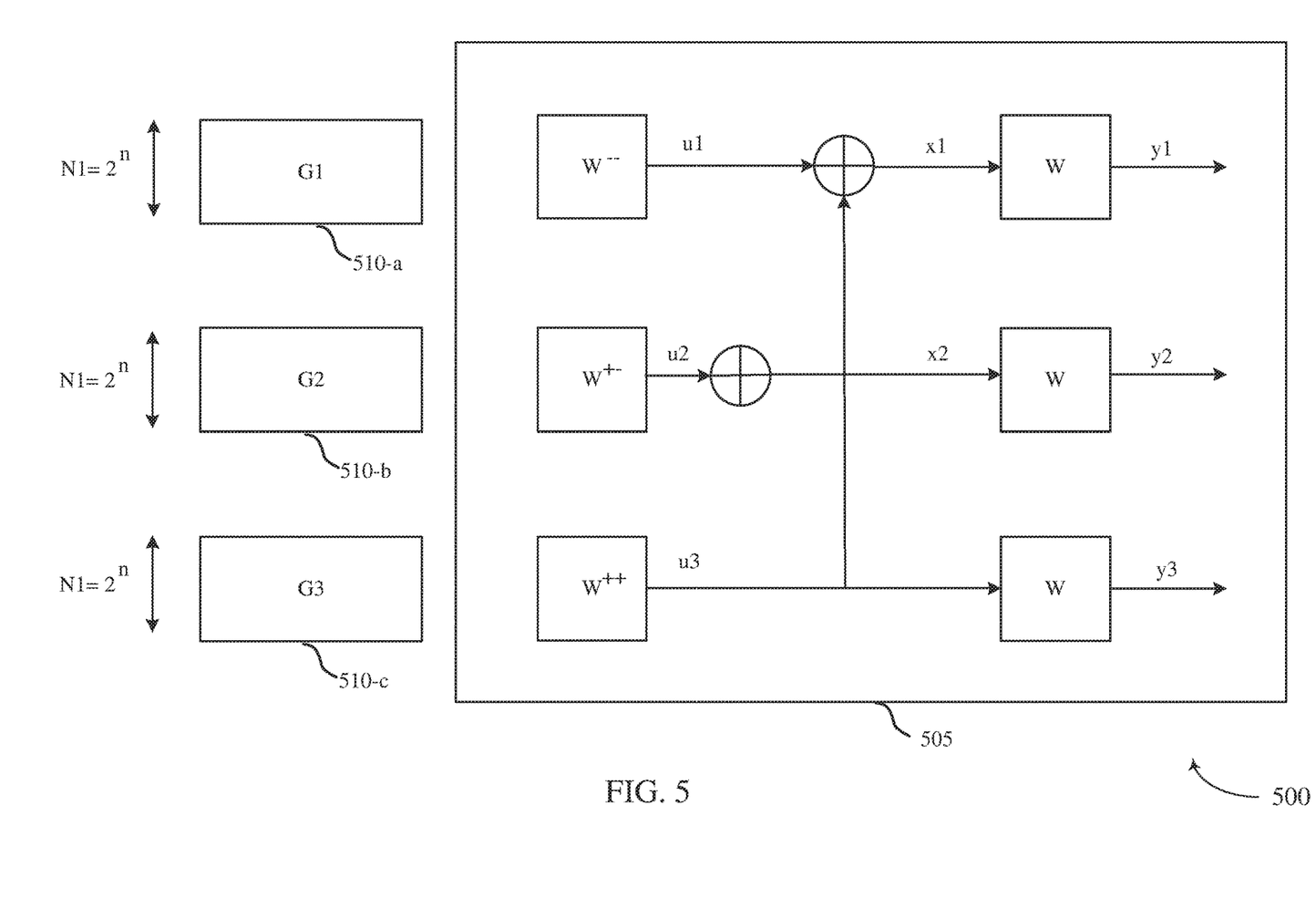
FIG. 5 is an example processing architecture diagram of an example process for allocating information bits using a capacity formula in accordance with aspects of the present disclosure.

In accordance with aspects of the present disclosure, the allocation of the information bits is adjusted based on the number of punctured bits (P) for the block puncturing polar codes. Particularly, features of the present disclosure determine the number of information bits for each sector 510 based on channel capacity after the puncturing. The capacity of each sector, e.g., R1, R2 and R3 can be derived from mutual information transfer chart using the information rate R=K/M as the input (Note: R1+R2+R3=3*R). Additionally, in some examples, the information bit distribution can be derived as: K1=R1*(N/3), K2=R1*(N/3), K3=R3*(N/3).

For low rate polar codes (e.g., R=K/M≤⅓), the block puncturing may be applied to the upper part of the channel (e.g., channel after XOR) which is then further subdivided into multiple sectors 510 (or more for finer granularity). If there is any punctured bit in the sector, then no information bits are allocated to that sector. Additionally, frozen bit positions (or other $K_i$ values) may be selected by using the Gaussian approximation (e.g. for $M=m*2^n$, m=1, 3, 5 and 7) or according to a predetermined good bit order and skipping the frozen bits before allocating K info bits.

Figure 6:
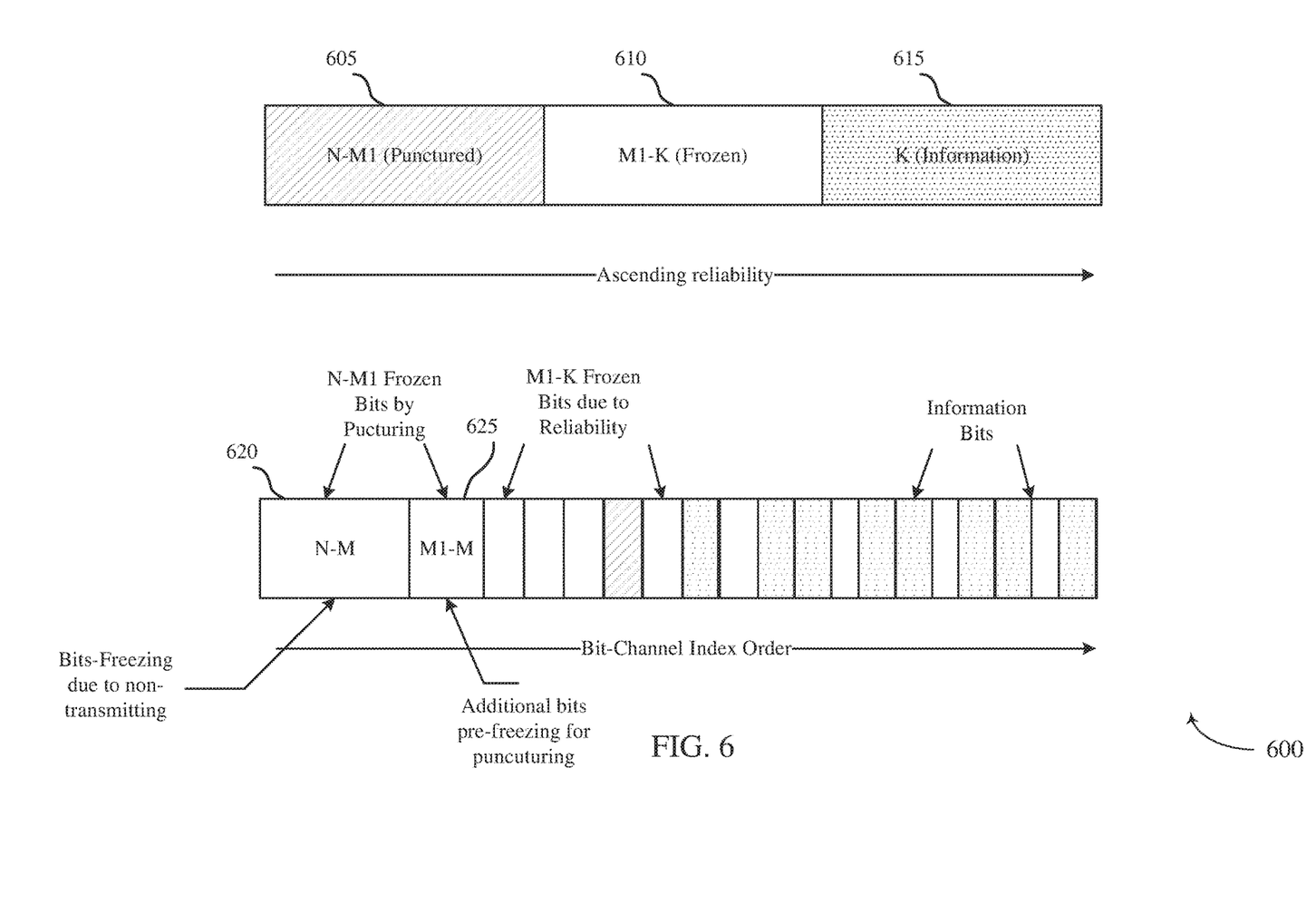
FIG. 6 is a block diagram of an example of a resulting bit structure to be input into an encoder after execution of a method of allocating the information bits using a predetermined bit order in accordance with aspects of the present disclosure.

Referring to FIG. 6, a diagram 600 illustrates a bit order structure as inputted into an encoder in accordance with a method of determining information bit allocation using a predetermined good bit order. In some examples, the first $N-M_1$ sub-channels 605 may be set to frozen bits and the remaining $M_1$ sub-channels 610 may be sorted based on the ascending reliability. Thereafter, the K information sub-channels 615 may be selected from the rightmost to the leftmost reliability while skipping the frozen sub-channels 610. Further, compared to the block puncturing without info set optimization, additional $M_1-M$ sub-channels may be set to frozen irrespective of reliability order.

Thus, in some examples, the number of untransmitted bits are P=N−M where N is the mother code block length of power of 2 and M is the code length. In some examples, instead of freezing all input bits with index 0<=u<=(N−M) as shown in FIG. 3, features of the present disclosure include techniques to freeze input bits with index 0<=u<(N−M1)

where M1>M. The location for information bits are then determined from the remaining N−M1 bit location. As such, features of the present disclosure may freeze input bits corresponding to untransmitted coded bits and also freeze additional bits (e.g., M1−M) for puncturing.

Figure 7:
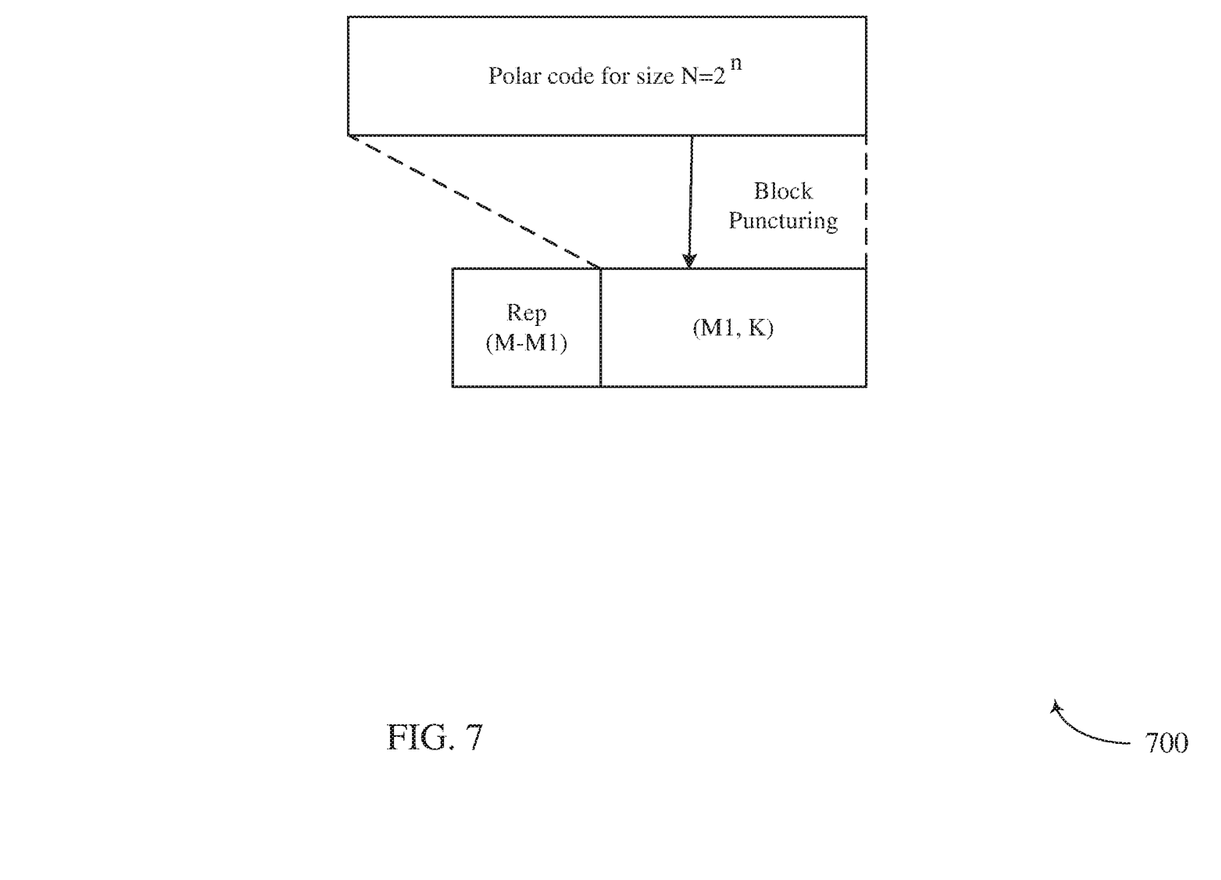
FIG. 7 is a block diagram of an example subframe structure resulting from execution of an aspect of a hybrid repetition and puncturing method in accordance with aspects of the present disclosure.

Referring to FIG. 7, in an alternative, an example aspect of hybrid repetition and puncturing frame structure 700 is illustrated. In this case, the M coded bits can be obtained by using a hybrid repetition and puncturing, e.g., repetition is used on top of polar code of size M1 where M1 is selected from 7N/8, 3N/4, 5N/8 and N/2 and N is a power of 2 larger than M, e.g., $N=2^{\lceil log\ 2(M) \rceil}$. Further, the block puncturing without info set optimization is used to obtain the M1 coded bits, e.g., selecting K good bits by skipping good bit indices on the punctured bits.

The solution of the present disclosure may have one or more advantages. The decoding complexity and delay of the proposed puncturing polar code is a function of the size $M_1$ instead of $N=2^n$ since the first $N-M_1$ bit channels are set to frozen bits.

Figure 8:
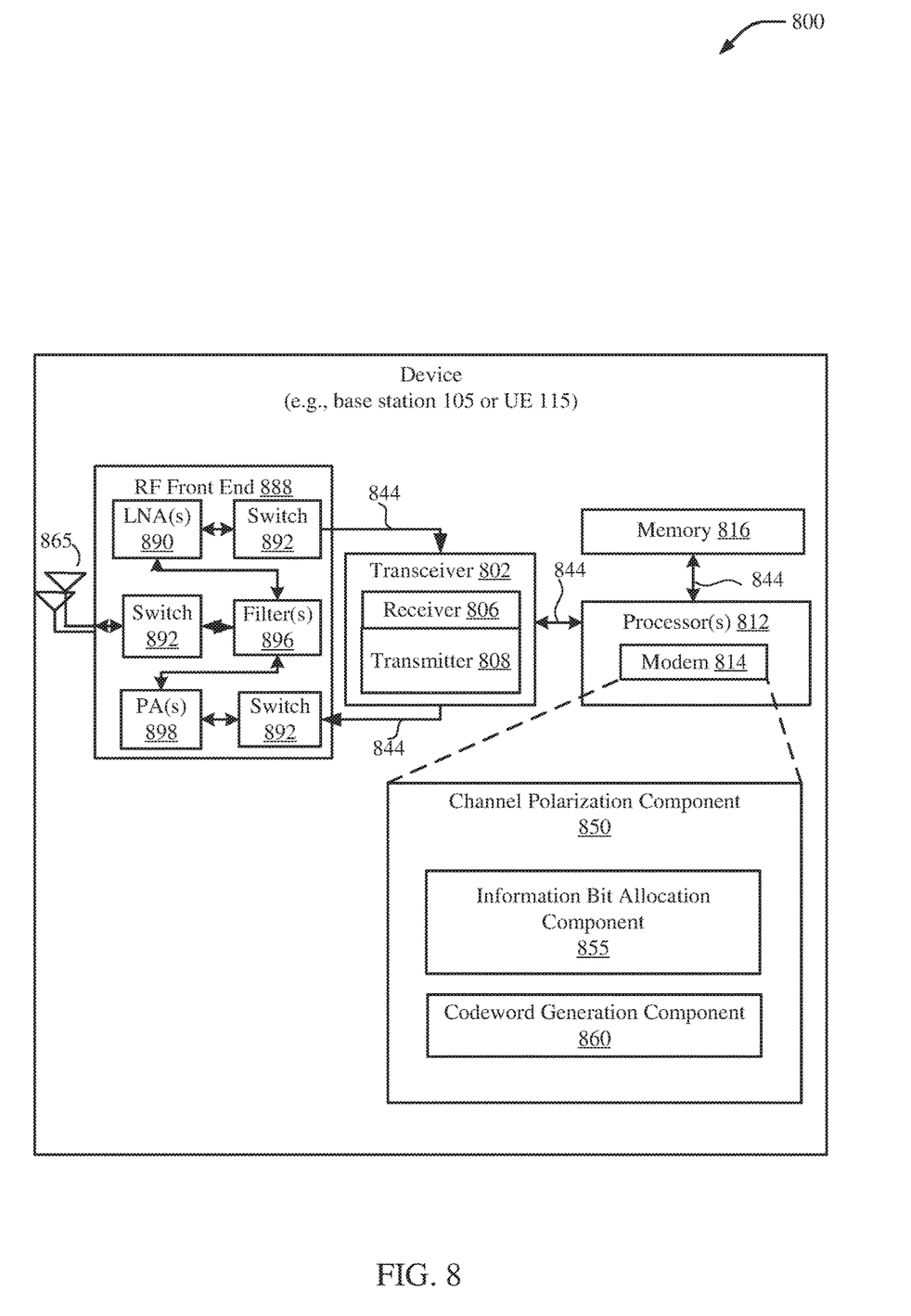
FIG. 8 is a schematic diagram of an aspect of an implementation of various components of a transmitting device (e.g., base station or a UE) in accordance with various aspects of the present disclosure.

FIG. 8 is an example of hardware components and subcomponents of a transmitting device that may be a UE 115 or a base station 105 for implementing one or more methods (e.g., method 900) described herein in accordance with various aspects of the present disclosure. For example, one example of an implementation of the transmitting device may include a variety of components, some of which have already been described above, but including components such as one or more processors 812 and memory 816 and transceiver 802 in communication via one or more buses 844, which may operate in conjunction with the channel polarization component 850.

The channel polarization component 850 may implement techniques described herein for rate matching codes polarization of wireless communications. In some examples, the channel polarization component 850 may determine a number of punctured bits for block puncturing polar codes. The channel polarization component 850 may also include an information bit allocation component 855 for adjusting allocation of information bits based on the number of punctured bits. The channel polarization component 850 may further include a codeword generation component 860 for generating a codeword for transmission over a wireless channel based on the allocation of the information bits.

The one or more processors 812, modem 814, memory 816, transceiver 802, RF front end 888 and one or more antennas 865, may be configured to support voice and/or data calls (simultaneously or non-simultaneously) in one or more radio access technologies. In an aspect, the one or more processors 812 can include a modem 814 that uses one or more modem processors. The various functions related to communication management component 850 may be included in modem 814 and/or processors 812 and, in an aspect, can be executed by a single processor, while in other aspects, different ones of the functions may be executed by a combination of two or more different processors. For example, in an aspect, the one or more processors 812 may include any one or any combination of a modem processor, or a baseband processor, or a digital signal processor, or a transmit processor, or a receiver processor, or a transceiver processor associated with transceiver 802. In other aspects, some of the features of the one or more processors 812 and/or modem 814 associated with communication management component 850 may be performed by transceiver 802.

Also, memory 816 may be configured to store data used herein and/or local versions of applications or communication management component 850 and/or one or more of its subcomponents being executed by at least one processor 812. Memory 816 can include any type of computer-readable medium usable by a computer or at least one processor 812, such as random access memory (RAM), read only memory (ROM), tapes, magnetic discs, optical discs, volatile memory, non-volatile memory, and any combination thereof. In an aspect, for example, memory 816 may be a non-transitory computer-readable storage medium that stores one or more computer-executable codes defining communication management component 850 and/or one or more of its subcomponents, and/or data associated therewith, when UE 115 is operating at least one processor 812 to execute communication management component 850 and/or one or more of its subcomponents.

Transceiver 802 may include at least one receiver 806 and at least one transmitter 808. Receiver 806 may include hardware, firmware, and/or software code executable by a processor for receiving data, the code comprising instructions and being stored in a memory (e.g., computer-readable medium). Receiver 806 may be, for example, a radio frequency (RF) receiver. In an aspect, receiver 806 may receive signals transmitted by at least one UE 115. Additionally, receiver 806 may process such received signals, and also may obtain measurements of the signals, such as, but not limited to, Ec/Io, SNR, RSRP, RSSI, etc. Transmitter 808 may include hardware, firmware, and/or software code executable by a processor for transmitting data, the code comprising instructions and being stored in a memory (e.g., computer-readable medium). A suitable example of transmitter 808 may including, but is not limited to, an RF transmitter.

Moreover, in an aspect, transmitting device may include RF front end 888, which may operate in communication with one or more antennas 865 and transceiver 802 for receiving and transmitting radio transmissions, for example, wireless communications transmitted by at least one base station 105 or wireless transmissions transmitted by UE 115. RF front end 888 may be connected to one or more antennas 865 and can include one or more low-noise amplifiers (LNAs) 890, one or more switches 892, one or more power amplifiers (PAs) 898, and one or more filters 896 for transmitting and receiving RF signals.

In an aspect, LNA 890 can amplify a received signal at a desired output level. In an aspect, each LNA 890 may have a specified minimum and maximum gain values. In an aspect, RF front end 888 may use one or more switches 892 to select a particular LNA 390 and its specified gain value based on a desired gain value for a particular application.

Further, for example, one or more PA(s) 898 may be used by RF front end 588 to amplify a signal for an RF output at a desired output power level. In an aspect, each PA 898 may have specified minimum and maximum gain values. In an aspect, RF front end 888 may use one or more switches 892 to select a particular PA 898 and its specified gain value based on a desired gain value for a particular application.

Also, for example, one or more filters 896 can be used by RF front end 888 to filter a received signal to obtain an input RF signal. Similarly, in an aspect, for example, a respective filter 896 can be used to filter an output from a respective PA 898 to produce an output signal for transmission. In an aspect, each filter 896 can be connected to a specific LNA 890 and/or PA 898. In an aspect, RF front end 888 can use one or more switches 892 to select a transmit or receive path using a specified filter 896, LNA 890, and/or PA 898, based on a configuration as specified by transceiver 802 and/or processor 812.

As such, transceiver 802 may be configured to transmit and receive wireless signals through one or more antennas 865 via RF front end 888. In an aspect, transceiver may be tuned to operate at specified frequencies such that transmitting device can communicate with, for example, one or more base stations 105 or one or more cells associated with one or more base stations 105. In an aspect, for example, modem 814 can configure transceiver 802 to operate at a specified frequency and power level based on the configuration of the transmitting device and the communication protocol used by modem 814.

In an aspect, modem 814 can be a multiband-multimode modem, which can process digital data and communicate with transceiver 802 such that the digital data is sent and received using transceiver 802. In an aspect, modem 814 can be multiband and be configured to support multiple frequency bands for a specific communications protocol. In an aspect, modem 814 can be multimode and be configured to support multiple operating networks and communications protocols. In an aspect, modem 814 can control one or more components of transmitting device (e.g., RF front end 888, transceiver 802) to enable transmission and/or reception of signals from the network based on a specified modem configuration. In an aspect, the modem configuration can be based on the mode of the modem and the frequency band in use. In another aspect, the modem configuration can be based on UE configuration information associated with transmitting device as provided by the network during cell selection and/or cell reselection.

Figure 9:
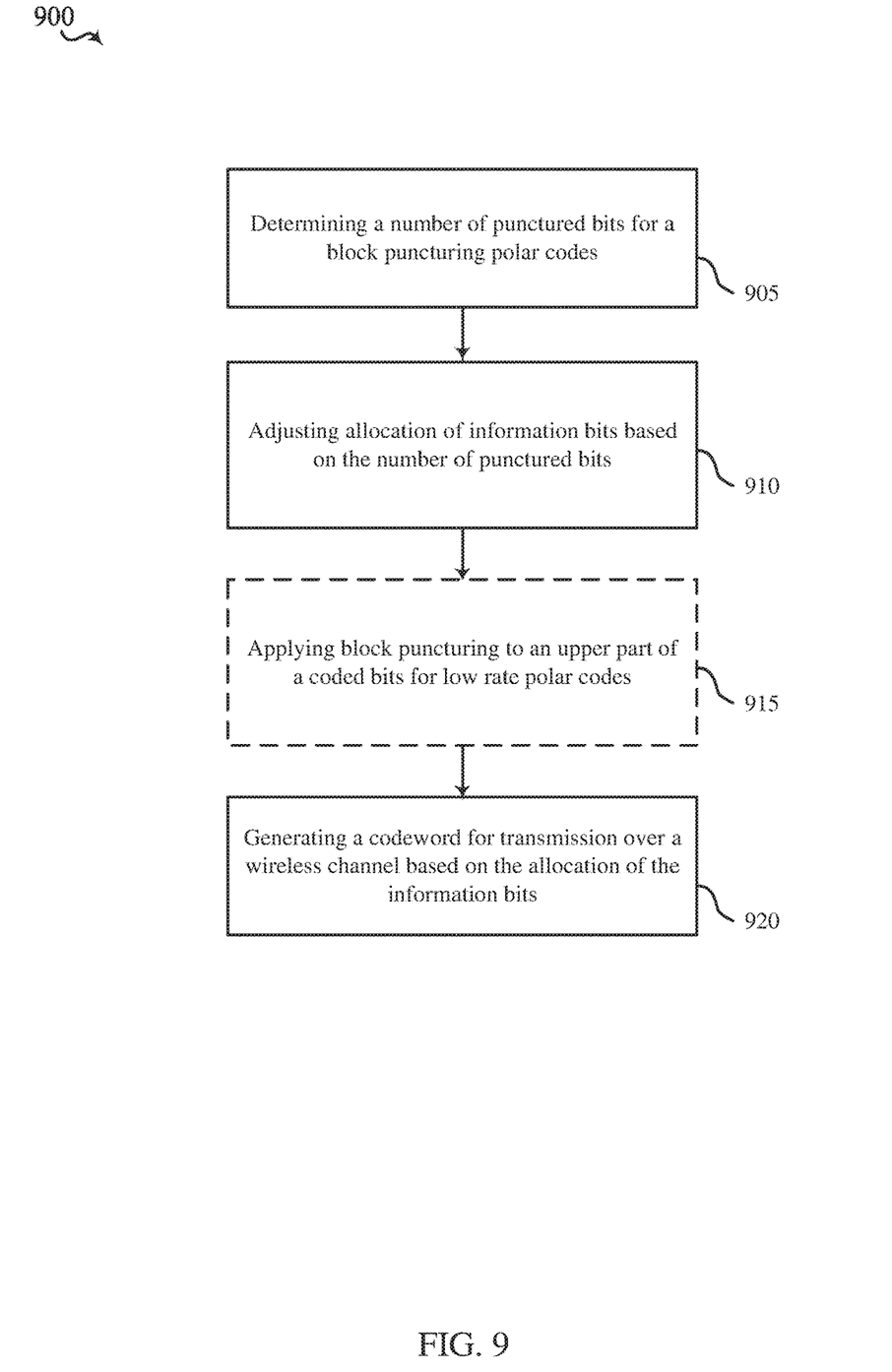
FIG. 9 is a flowchart of an example method implemented by the UE for rate matching codes polarization of wireless communications in accordance with aspects of the present disclosure.

FIG. 9 is a flowchart of an example of a method 900 of wireless communication implemented by either an base station or a UE, in accordance with aspects of the present disclosure. Thus, the method 900 may be performed using a device (e.g., base station 105 or UE 115) acting as a transmitting device. Although the method 900 is described below with respect to the elements of base station 105 or UE 115, other components may be used to implement one or more of the actions described herein.

At block 905, the method 900 may include determining a number of punctured bits for a block puncturing polar codes. Aspects of 905 may be performed by channel polarization components 850 described with reference to FIG. 8.

At block 910, the method 900 may include adjusting allocation of information bits based on the number of punctured bits. In some examples, the method may determine whether any punctured bits are in a sector of a plurality of sectors of a channel. If the punctured bits are absent from a sector (e.g., not in the sector), the method may allocate the information bits in that sector. However, if one or more punctured bits are in a sector, the method may instead allocate one or more frozen bits into that sector. Selecting a position for one or more frozen bits may include using the Gaussian approximation. The position for the one or more frozen bits is selected such that a first sub-channel portion is set for the one or more frozen bits and a second sub-channel portion is sorted based on ascending reliability. In some examples, the M coded bits may be obtained by using hybrid repetition and puncturing. Additionally or alternatively, features of the present disclosure may freeze input bits corresponding to untransmitted coded bits. Further, additional bits (M1−M in FIG. 6, where M1 is greater than M) may be frozen for puncturing for input bits with index 0<=u<(N−M1). Aspects of 1010 be performed by information bit allocation component 855 described with reference to FIG. 8.

At block 915, the method 900 may optionally include applying block puncturing to an upper part of a coded bits for low rate polar codes. In some examples, the method 900 may also include utilizing block puncturing without information set optimization to obtain a number of coded bits for codeword. Aspects of 905 may be performed by channel polarization components 850 described with reference to FIG. 8.

At block 920, the method 900 may include generating a codeword for transmission over a wireless channel based on the allocation of the information bits. Aspects of 920 be performed by codeword generation component 860 described with reference to FIG. 8.

The above detailed description set forth above in connection with the appended drawings describes examples and does not represent the only examples that may be implemented or that are within the scope of the claims. The term "example," when used in this description, means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, computer-executable code or instructions stored on a computer-readable medium, or any combination thereof.

The various illustrative blocks and components described in connection with the disclosure herein may be implemented or performed with a specially-programmed device, such as but not limited to a processor, a digital signal processor (DSP), an ASIC, a FPGA or other programmable logic device, a discrete gate or transistor logic, a discrete hardware component, or any combination thereof designed to perform the functions described herein. A specially-programmed processor may be a microprocessor, but in the alternative, the processor may be any conventional processor, controller, microcontroller, or state machine. A specially-programmed processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a non-transitory computer-readable medium. Other examples and implementations are within the scope and spirit of the disclosure and appended claims. For example, due to the nature of software, functions described above can be implemented using software executed by a specially programmed processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

It should be noted that the techniques described herein may be used for various wireless communication networks such as CDMA, TDMA, FDMA, OFDMA, SC-FDMA, and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases 0 and A are commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM). An OFDMA system may implement a radio technology such as Ultra Mobile Broadband (UMB), Evolved UTRA (E-UTRA), IEEE 802.11 (Wi-Fi), IEEE 802.16 (WiMAX), IEEE 802.20, Flash-OFDM™, etc. UTRA and E-UTRA are part of Universal Mobile Telecommunication System (UMTS). 3GPP Long Term Evolution (LTE) and LTE-Advanced (LTE-A) are new releases of UMTS that use E-UTRA. UTRA, E-UTRA, UMTS, LTE, LTE-A, and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies, including cellular (e.g., LTE) communications over a shared radio frequency spectrum band. The description below, however, describes an LTE/LTE-A system for purposes of example, and LTE terminology is used in much of the description below, although the techniques are applicable beyond LTE/LTE-A applications (e.g., to 5G networks or other next generation communication systems).

The previous description of the disclosure is provided to enable a person skilled in the art to make or use the disclosure. Various modifications to the disclosure will be readily apparent to those skilled in the art, and the common principles defined herein may be applied to other variations without departing from the spirit or scope of the disclosure. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise. Thus, the disclosure is not to be limited to the examples and designs described herein but is to be accorded the widest scope consistent with the principles and novel features disclosed herein.

What is claimed is:

1. A method for rate matching in wireless communications, comprising:
    puncturing one or more bits of a data block;
    adjusting an allocation of information bits of the data block based on the one or more punctured bits, the adjusting comprising freezing input bits corresponding to untransmitted bits of the data block;
    generating, using polar coding, a codeword for transmission over a wireless channel based on the allocation of the information bits; and
    transmitting the generated codeword using the wireless channel.

2. The method of claim 1, wherein adjusting the allocation of the information bits based on the one or more punctured bits comprises:
    freezing additional bits for the allocation of the information bits.

3. The method of claim 1, wherein adjusting the allocation of the information bits based on the one or more punctured bits comprises:
    applying block puncturing to an upper part of a set of coded bits for low rate polar codes.

4. The method of claim 1, wherein adjusting the allocation of the information bits based on the one or more punctured bits comprises:
    determining whether any punctured bits are in a sector of a plurality of sectors of a channel; and
    allocating the information bits in the sector if the one or more punctured bits are absent from the sector.

5. The method of claim 1, wherein adjusting the allocation of the information bits based on the one or more punctured bits comprises:
    determining whether any punctured bits are in a sector of a plurality of sectors of sectors of a channel; and
    allocating one or more frozen bits in the sector if the one or more punctured bits are present in the sector.

6. The method of claim 1, further comprising:
    selecting a position for one or more frozen bits using a Gaussian approximation.

7. The method of claim 6, wherein the position for the one or more frozen bits is selected such that a first sub-channel portion is set for the one or more frozen bits and a second sub-channel portion is sorted based on ascending reliability.

8. The method of claim 1, further comprising obtaining a quantity of M coded bits using hybrid repetition and puncturing.

9. The method of claim 1, further comprising:
    utilizing block puncturing without information set optimization to obtain a number of coded bits for the codeword.

10. An apparatus for rate matching in wireless communications, comprising:

a memory configured to store instructions; and a processor coupled with the memory, the processor configured to execute the instructions to:

puncture one or more bits of a data block;

adjust an allocation of information bits of the data block based on the one or more punctured bits, the adjusting comprising freezing input bits corresponding to untransmitted bits of the data block;

generate, using polar coding, a codeword for transmission over a wireless channel based on the allocation of the information bits; and transmit the generated codeword using the wireless channel.

11. The apparatus of claim 10, wherein the instructions to adjust the allocation of the information bits based on the one or more punctured bits are further configured to:

freeze additional bits for the allocation of the information bits.

12. The apparatus of claim 10, wherein the instructions to adjust the allocation of the information bits based on the one or more punctured bits further comprise instructions executable by the processor to:

apply block puncturing to an upper part of a set of coded bits for low rate polar codes.

13. The apparatus of claim 10, wherein the instructions to adjust the allocation of the information bits based on the one or more punctured bits further comprise instructions executable by the processor to:

determine whether any punctured bits are in a sector of a plurality of sectors of a channel; and allocate the information bits in the sector if the one or more punctured bits are absent from the sector.

14. The apparatus of claim 10, wherein the instructions to adjust the allocation of the information bits based on the one or more punctured bits further comprise instructions executable by the processor to:

determine whether any punctured bits are in a sector of a plurality of sectors of a channel; and allocate one or more frozen bits in the sector if the one or more punctured bits are present in the sector.

15. The apparatus of claim 10, further comprising instructions executable by the processor to:

select a position for one or more frozen bits using a Gaussian approximation.

16. The apparatus of claim 15, wherein the position for the one or more frozen bits is selected such that a first sub-channel portion is set for the one or more frozen bits and a second sub-channel portion is sorted based on ascending reliability.

17. The apparatus of claim 10, further comprising instructions executable by the processor to obtain a quantity of M coded bits using hybrid repetition and puncturing.

18. The apparatus of claim 10, further comprising instructions executable by the processor to:

utilize block puncturing without information set optimization to obtain a number of coded bits for the codeword.

19. A non-transitory computer-readable medium storing computer-executable instructions executable by a processor for channel polarization with rate matching in wireless communications, comprising instructions executable for:

puncturing one or more bits of a data block;

adjusting an allocation of information bits of the data block based on the one or more punctured bits, the adjusting comprising freezing input bits corresponding to untransmitted bits of the data block;

generating, using polar coding, a codeword for transmission over a wireless channel based on the allocation of the information bits; and transmitting the generated codeword using the wireless channel.

20. The non-transitory computer-readable medium of claim 19, wherein the instructions for adjusting the allocation of the information bits based on the one or more punctured bits further comprises instructions for:

applying block puncturing to an upper part of a set of coded bits for low rate polar codes.

21. The non-transitory computer-readable medium of claim 19, wherein the instructions for adjusting the allocation of the information bits based on the one or more punctured bits further comprise instructions for:

determining whether any punctured bits are in a sector of a plurality of sectors of a channel; and allocating the information bits in the sector if the one or more punctured bits are absent from the sector.

22. The non-transitory computer-readable medium of claim 19, wherein the instructions for adjusting the allocation of the information bits based on the one or more punctured bits further comprise instructions for:

determining whether any punctured bits are in a sector of a plurality of sectors of a channel; and allocating one or more frozen bits in the sector if the one or more punctured bits are present in the sector.

23. The non-transitory computer-readable medium of claim 19, further comprising instructions for:

selecting a position for one or more frozen bits using a Gaussian approximation.

24. The non-transitory computer-readable medium of claim 23, wherein the position for the one or more frozen bits is selected such that a first sub-channel portion is set for the one or more frozen bits and a second sub-channel portion is sorted based on ascending reliability.

25. The non-transitory computer-readable medium of claim 19, further comprising instructions for obtaining a quantity of M coded bits using hybrid repetition and puncturing.

26. The non-transitory computer-readable medium of claim 19, further comprising instructions for:

utilizing block puncturing without information set optimization to obtain a number of coded bits for the codeword.

27. An apparatus for rate matching codes polarization of wireless communications, comprising:

means for puncturing one or more bits of a data block;

means for adjusting an allocation of information bits of the data block based on the one or more punctured bits, the adjusting comprising freezing input bits corresponding to untransmitted bits of the data block;

means for generating, using polar coding, a codeword for transmission over a wireless channel based on the allocation of the information bits; and means for transmitting the generated codeword using the wireless channel.

28. The apparatus of claim 27, wherein the means for adjusting the allocation of the information bits based on the one or more punctured bits comprises:

means for applying block puncturing to an upper part of a set of coded bits for low rate polar codes.

* * * * *